(12) United States Patent
Diduck et al.

(10) Patent No.: US 7,425,915 B1
(45) Date of Patent: Sep. 16, 2008

(54) FREQUENCY MODULATION BASED FLASH ADC

(75) Inventors: Quentin Diduck, Rochester, NY (US);
Martin Margala, Pittsford, NY (US)

(73) Assignee: University of Rochester, Rochester, NY (US)

( * ) Notice: Subject to any disclaimer, the term of this patent is extended or adjusted under 35 U.S.C. 154(b) by 517 days.

(21) Appl. No.: 11/133,450

(22) Filed: May 20, 2005

Related U.S. Application Data

(60) Provisional application No. 60/572,496, filed on May 20, 2004.

(51) Int. Cl.
*H03M 1/60* (2006.01)
(52) U.S. Cl. .................... 341/157; 341/155; 341/177
(58) Field of Classification Search .......... 341/155–172
See application file for complete search history.

(56) References Cited

U.S. PATENT DOCUMENTS

| | | | | |
|---|---|---|---|---|
| 4,593,266 A | * | 6/1986 | Palmer | ...................... 341/157 |
| 5,465,109 A | * | 11/1995 | Bowers | ........................ 347/74 |
| 6,072,416 A | * | 6/2000 | Shima | ........................ 341/159 |
| 6,369,743 B2 | * | 4/2002 | Ono | ............................ 341/159 |
| 6,777,922 B2 | * | 8/2004 | Tajima et al. | ............. 324/76.75 |
| 6,822,597 B2 | * | 11/2004 | Draxelmayr et al. | ........ 341/155 |
| 7,075,383 B2 | * | 7/2006 | Adachi et al. | ................ 332/127 |
| 7,142,145 B1 | * | 11/2006 | Lauritzen et al. | ............ 341/155 |
| 7,224,238 B2 | * | 5/2007 | Adachi et al. | ................ 332/127 |
| 2006/0187105 A1 | * | 8/2006 | Sakata et al. | ................. 341/155 |
| 2007/0200645 A1 | * | 8/2007 | Adachi et al. | ................ 332/127 |

* cited by examiner

*Primary Examiner*—Linh V Nguyen
(74) *Attorney, Agent, or Firm*—Blank Rome LLP

(57) ABSTRACT

An analog-to-digital converter converts a frequency-modulated signal into a digital signal. The frequency-modulated signal is supplied to multiple comparators, such as low-pass filters, which determine whether the signal falls within their frequency ranges. The outputs of the comparators are converted into a digital output signal, e.g., by fat-tree encoding. Each comparator has a differently tuned capacitive load to cause a phase delay in the input signal. When the phase-delayed and non-phase-delayed signals are supplied to a D-Flop, the phase delay is determined by whether the latch conditions are met.

13 Claims, 4 Drawing Sheets

FREQUENCY MODULATION BASED FLASH ADC

REFERENCE TO RELATED APPLICATION

The present application claims the benefit of U.S. Provisional Patent Application No. 60/572,496, filed May 20, 2004, whose disclosure is hereby incorporated by reference in its entirety into the present disclosure.

FIELD OF THE INVENTION

The present invention is directed to an analog-to-digital converter (ADC) and more particularly to an ADC which is based upon converting frequency modulation (FM) signals to digital signals.

DESCRIPTION OF RELATED ART

Current analog-to-digital conversion techniques rely on the ability to very accurately discriminate very small voltages or currents. Those voltage-based techniques are facing an ever-decreasing operating range as technology is scaled. Those methods require complex analog components that are becoming more difficult to design and fabricate.

Typical ADC designs suffer from multiple sources of error, even in the basic Flash design. Comparator circuits have to be designed to distinguish from mV to sub mV ranges for reasonable resolutions. That leads to large sensitivity to power supply noise. Also, there are invariably some offset errors that are introduced due to the complexity of the analog circuits involved.

In a different field of endeavor, current wired and wireless telecommunication devices typically demodulate an analog FM signal and then convert it to a digital signal suitable for digital signal processing. Such demodulation and conversion require a complex setup involving analog mixers, demodulators and down-converters.

SUMMARY OF THE INVENTION

It is thus an object of the invention to provide an ADC which is easy to fabricate and which overcomes the above-noted deficiencies of the prior art.

It is another object of the invention to provide the ability to build high-speed analog to digital converters in a very low voltage process.

It is still another object of the invention to provide the ability to trade off speed for accuracy.

To achieve the above and other objects, the invention is directed to a converter which works on a frequency modulated signal rather than on a conventional voltage or current based signal. The present invention thus functions over a specified frequency bandwidth rather than a voltage or current range. Frequency bandwidth is increasing with technological advancement, whereas voltages and currents are decreasing. That design methodology will improve with technology scaling and can still operate under low voltage conditions.

With a signal which is frequency based, we use analog signal processing methods to determine the characteristics of the signal. By utilizing basic filtering techniques, we have found a relatively simple method that seems effective in determining the exact frequency of a signal very rapidly and accurately. We selectively filter out each frequency corresponding to a particular bit. One can think of that approach similar to having several FM receivers each tuned to a particular bit (in our case, the receiver picks up all frequencies below its cutoff). As the source changes frequency, each tuner picks it up the frequency match. By placing several such structures in parallel with varied tuned natural frequencies, the present invention enables multiple frequencies to be examined simultaneously. The result is a thermometer-coded signal that is then encoded. Since that style converter design is intended for high-speed operation, the decoding circuitry after the latches has to be designed to meet the performance requirements. Fat-tree encoding has been found to be the best design thus far, although any equivalent can be used. The FM source wave acts as the driving clock for the circuit, so that a sample is processed every cycle of the signal.

The present invention has several advantages over current design methods. The advantages of that conversion technique stem from multiple areas. We are essentially no longer concerned with voltage range with that design. The complexity of the required circuitry is greatly reduced, and essentially becomes minimum size digital components almost immediately after the FM source. Accuracy can be inherently traded for performance without explicitly redesigning the comparator architecture. As well, that design technique is scalable and its behavior is essentially independent of operating voltage, but rather dependent upon switching speed.

A particular embodiment is directed to a 6-bit frequency modulation based ADC. The demonstrated device uses less than 10% of the power of comparable devices. In addition, that architecture provides a simple and logical way to trade sampling rate for accuracy. That embodiment has a power consumption of 30 mW while operating at approximately 1.05 GSamples/Sec with an INL and DNL values of 0.23 and 0.4/−0.3 LSB respectively. The design has been implemented in an 1.8 Volt 0.18 µm CMOS process.

A particular type of frequency modulation which the present invention can be adapted to detect is pulse width modulation. The frequency comparators can detect a change in pulse width in the same manner as described above; that is, each comparator responds to a longer or shorter pulse width. The larger the capacitor, the larger the pulse which it detects.

BRIEF DESCRIPTION OF THE DRAWINGS

A preferred embodiment of the invention will be set forth in detail with reference to the drawings, in which.

DETAILED DESCRIPTION OF THE PREFERRED EMBODIMENT

Figure 1:
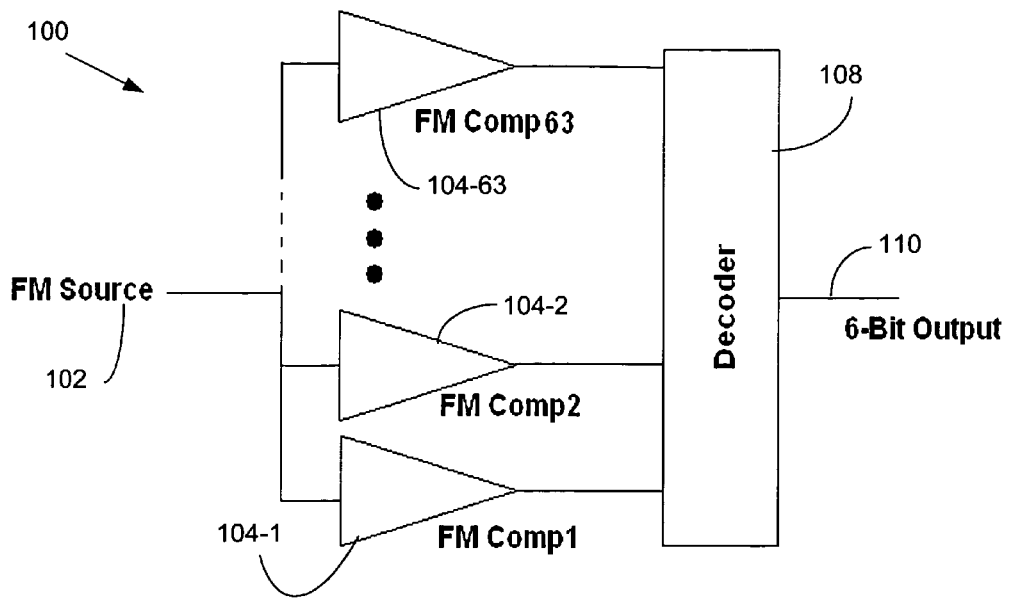
FIG. 1 is a block diagram showing an FM based ADC according to the preferred embodiment.

A preferred embodiment of the present invention will be set forth in detail with reference to the drawings, in which like reference numerals refer to like elements throughout.

FIG. 1 shows a basic block diagram of the device 100. At the front of the device, we have a driver from an FM source 102 and an array of one bit frequency comparators 104-1, 104-2, ... 104-63. Those frequency comparators perform a very similar function to their voltage or current equivalents. They determine whether a frequency is above or below a given point. Each comparator is essentially a low or high pass filter designed to respond to a particular frequency range and to provide an output stating either "The frequency is above the upper bound of my range" or "The frequency is below the upper bound of my range." Each range is slightly larger than the range for a preceding one of the comparators.

The output signals from each of those comparators are then fed into a decoder 106 (e.g., a Fat Tree encoder which is identical to a Flash converter). The output signals from the comparators 104-1 through 104-63 present what is essentially a thermometer graph. That is, there will be two continuous blocks of output signals, one indicating, "The frequency is above the upper bound of my range," and the other indicating, "The frequency is below the upper bound of my range." Thus, the decoder 106 can identify the frequency to within the difference between two adjacent ones of the ranges.

In the case in which 63 comparators 104-1 through 104-63 are used, there are 64 possible sets of output signals from the comparators. Thus, the decoder 108 is capable of detecting any of 64 levels and producing a six-bit digital output signal ($2^6$=64). Of course, a different number of comparators would produce a different number of possible sets of output signals, for a different bit length of the digital output signal from the decoder.

Figure 2:
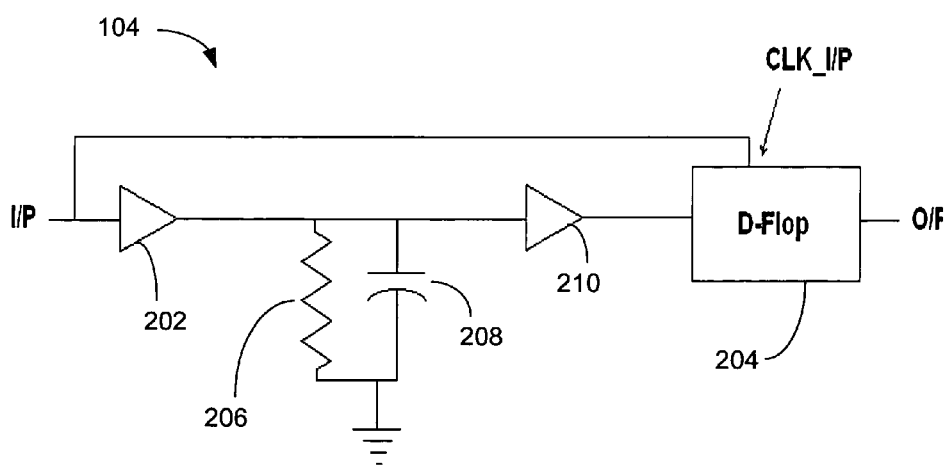
FIG. 2 is a schematic diagram of a one-bit frequency comparator used in the ADC of FIG. 1.
Figure 3:
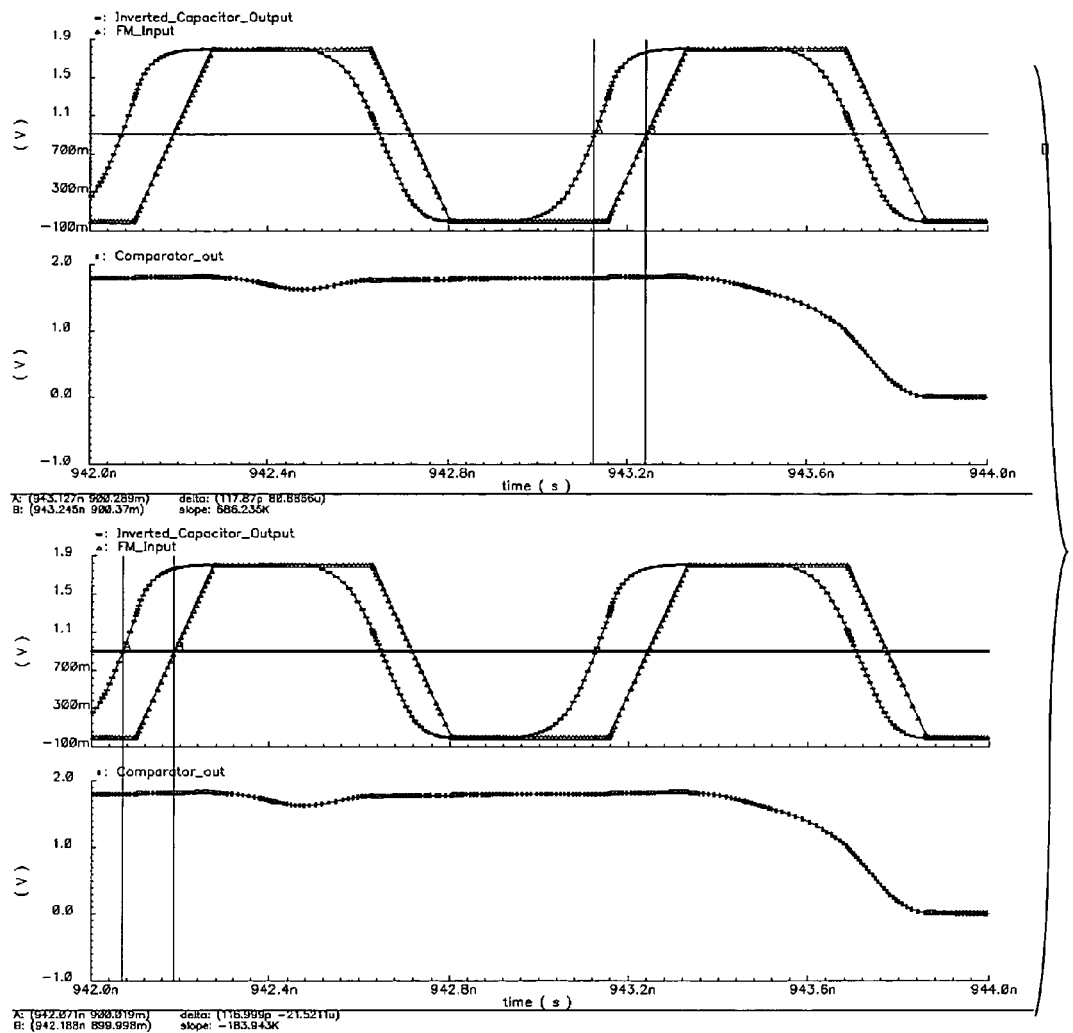
FIG. 3 is a set of graphs of phase timing of the one-bit comparator of FIG. 2.

FIG. 2 is a schematic diagram of a comparator 104, i.e., any of the comparators 104-1 through 104-63 of FIG. 1. The design of the frequency comparator is based on the principle of parasitic capacitance. It is well known that a large parasitic capacitance reduces the operating speed of logic circuitry. We use that mechanism as a method of determining the frequency of the input. We systematically adjust the capacitive load of a buffer 202. The signal that feeds the buffer 202 also provides the clock signal to a D-flop 204. The buffer 202 and resistor 206 on the left limit the current to the capacitor 208, and the buffer 210 on the right recovers the magnitude of the signal. The change in phase of the signal is used to determine the frequency. By increasing the load on the buffer 210, the frequency to which the flop 204 will latch is reduced. Effectively, the phase of the signal is altered to the point where it is out of phase with the clock signal of the flop 204, as will be explained below with reference to FIG. 3. That way, it is possible to tune the frequency of the comparator.

In order to provide a more consistent circuit behavior, an active load (e.g., the resistor 206) is tied to the capacitor. The active load controls the current flow and acts as a temperature stabilizer. As temperature increases, the drive current of the buffer increases; however, the resistance of the active load decreases, keeping the frequency response of circuit constant. Using that method, we are able to operate our comparator over a temperature range of 50 degrees Celsius with less than one bit fluctuation; a larger range is possible, but the frequency bandwidth has to be increased. The D-Flop 204 provides a steady state output for the decoder logic of the circuit. That circuit does not use any typical analog components. Thus, the basic limitations of typical ADC designs are overcome.

There are two basic methods to design a frequency comparator. The first uses a low pass filter, and the second uses a high pass filter. A filter based upon an RC circuit introduces a phase variance over a frequency range. We use that phase variance to determine the frequency of the input. The D-Flop is used as a phase detector. If sufficient phase change has occurred, then the flop will fail to latch the input signal. That can be seen by comparing the two pairs of plots in FIG. 3. The change in delta shows that a 1 ps delay in phase results in a change of state in the flop. In order to create that phase delay over the required operating frequency, large capacitors would have to be used. However, there is an effective way to reduce the size of the required capacitors. We can introduce fixed delays by introducing buffers ahead of the capacitors. The clock signal for the D-Flop is sourced ahead of the buffer chain and the capacitor (the buffers depicted in FIG. 2 are actually composed of chained inverters). As well, we have to recover the magnitude of the signal after the phase of the signal has been altered, so recovery buffers are added after the capacitor. Each of those buffers introduces delays in the propagating signal and shifts the phase in relation to the original source signal. That enables us to reduce the capacitor size as well as tune the comparator to a particular frequency range. The magnitude of the voltage right after the capacitor is given by $$\text{Magnitude} = 20 \log_{10}(w/w_0) \quad (1)$$

As the frequency goes well beyond the range of the filter, the magnitude of the input signal will eventually be unrecoverable. As a result, the input to the D-Flop has to be set up such that the correct output state is maintained when that secondary condition occurs. That is to say, the flop should be set so that no signal should be the same output as an out of phase signal.

The phase has an inverse tangent function characteristic that we treat as linear over a small range. To place the signal within that phase range, we use delay buffers as mentioned above, and size our capacitors appropriately for each bit. To reduce variations in accuracy the latch design chosen exhibits minimal behavioral fluctuation with temperature. That was achieved using a pass transistor logic design. Since we utilize the phase instead of the magnitude for bit determination, we can determine the exact latching behavior by knowing the setup time of the latch. Once the phase is delayed such that the setup conditions are not met, the latch will not detect the signal and provides us with the phase detection. In experimentation it was found that the comparator design could detect a phase change as small as 2 ps over a 50 degree temperature range.

Increasing the bandwidth of the FM converter will significantly reduce the problems faced by conventional ADC's as noted above. We utilize a specified frequency bandwidth to describe a single data bit. Should that type of device be required to operate under "noisy" conditions, we can increase the bandwidth for each bit to compensate. If we consider that the filter will have a finite cutoff range regardless how much we increase the bandwidth, it becomes clear that each bit can be made more precise if we increase the device bandwidth. Since by increasing the range of frequencies for each bit, there is a reduction the over all percentage of bandwidth consumed in the cutoff region. We can estimate the percent error in a bit by:

$$\text{BitError} = \Delta f / \text{Bit}BW \quad (2)$$

where $\Delta f$ is the frequency variance in the cutoff and BitBW is the Frequency Bandwidth per bit.

In order to determine the frequency variance in cutoff, we have to consider the filter transfer function. For our low pass version, that is $$T(s) = 1/(s + w_0) \quad (3)$$

We know that the magnitude of the voltage will be $$\text{Magnitude} = 20 \log_{10}(w/w_0)$$

and the phase is $$\text{Phase} = \tan^{-1}(w/w_0) \quad (4)$$

The phase is used for bit determination, so in order to determine the variance of our bit, we have to determine the variance of the setup time in the actual latch. That is latch design dependent; however, our design yielded a set up time of 119 ps±1 ps. When we operate with a center frequency of 1.05 GHz, we see that that would be a 0.2% variance in the resolution of the phase. That is determined by $2 \times 10^{-12}$ seconds/$(1/1.05 \times 10^9)$ seconds; that is, a variance of 0.72 degrees. To achieve a 0.72 degree phase difference only requires a change of frequency of 1.25%. However if we were to reduce the frequency of operation to 100 MHz, the accuracy would jump to 0.02% or 0.072 degrees. That would result in an increase in accuracy by a factor of 10. From that example it is clear that we can increase the accuracy by trading bandwidth.

While we have discussed the comparator design, we have to consider the effect of placing several comparators together to form a converter. In fact, a very interesting behavior was observed in simulation. Since that design is based highly on capacitance, all forms of capacitance need to be accounted for in the design. In particular, the end comparators need careful sizing. For a comparator in the middle of the design, the fringe effects of its neighbors need to be taken into account. In general, we found that we were able to linearly size the capacitors with only a minor correction factor needing to be applied for the fringing for all the comparators except the two devices at the ends. Those devices had to be increased in size to compensate for the lack of fringe effect. One may consider placing pseudo-capacitors next to the end comparators to eliminate the need for adjustment.

By utilizing 63 FM based comparators, a 6-bit Frequency ADC was implemented. That ADC design essentially is implemented like a conventional flash ADC design; however, that design has several advantages. Due to the comparator design, we have a range of flexibility in choosing accuracy over speed. Also, we are no longer concerned with the available voltage range. Those two features are significant; however, what is of greater interest is that the power consumption of that design is an order of magnitude less than designs of comparable performance, while maintaining identical or better accuracy.

While most ADC applications are not FM based, there are several techniques to convert signals to FM using mixers. As well, there are application such as cell phones and magnetic media applications where the signal is frequency modulated. The present invention can easily be extended to the particular needs of each of those applications. The low power nature of that converter should make is suitable for portable applications.

Figure 4:
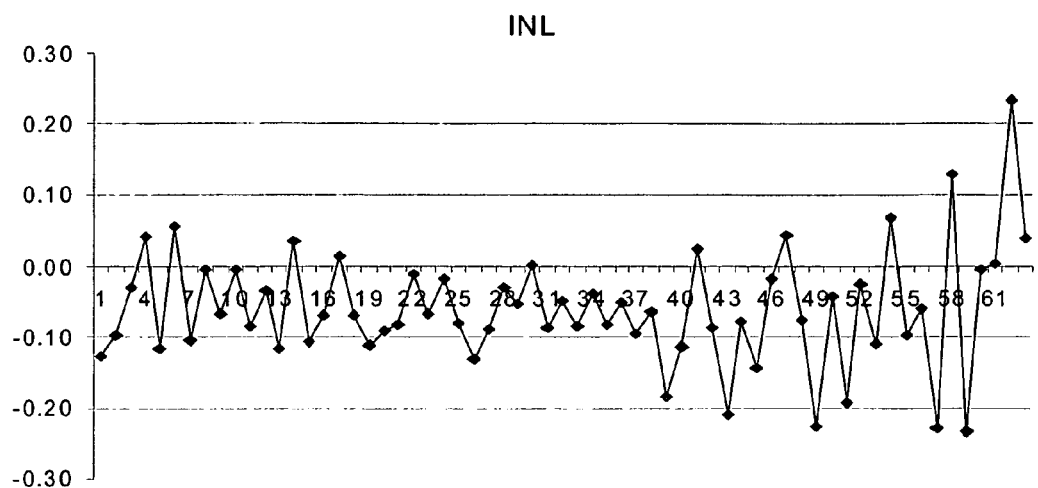
FIG. 4 shows INL performance.
Figure 5:
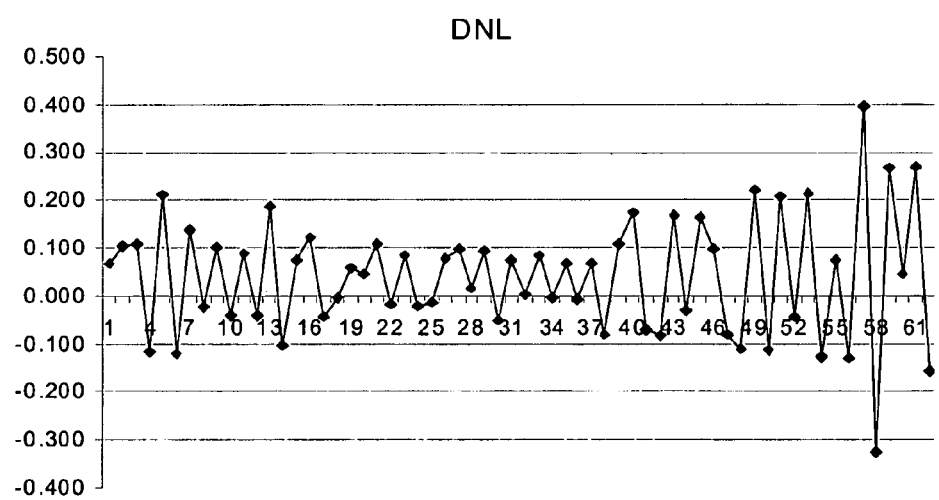
FIG. 5 shows DNL performance.
Figure 6:
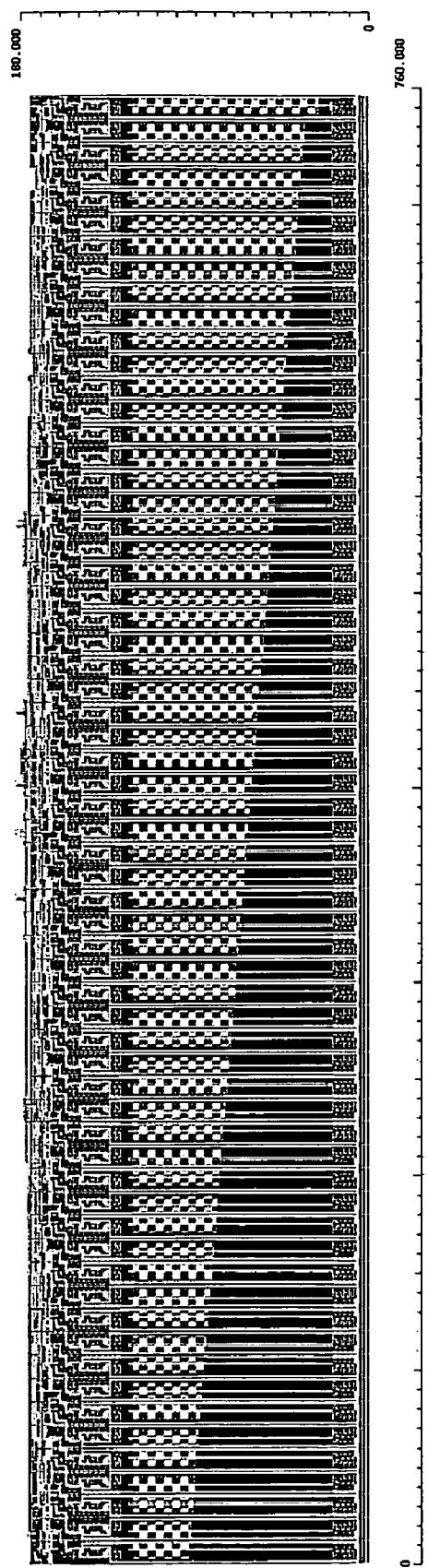
FIG. 6 shows a layout of the ADC of FIG. 1 in a 0.18 µm standard CMOS process.

The FM ADC was simulated using full extraction in Layout. A six-bit FM based ADC layout in a 0.18 µm standard CMOS process is shown in FIG. 6. The FM ADC has a center frequency of 1.05 GHz and consumes 30 mW of power. That power consumption is less than one tenth of the flash designs known in the art (see Table I). Even at that relatively high speed we were able to produce very accurate results as that converter has an INL of only 0.23 and a DNL of 0.4/−0.3 LSB. The INL and DNL performance are shown in FIGS. 4 and 5, respectively.

TABLE I

|  | Known | Current |
| --- | --- | --- |
| Technology | 180 nm CMOS | 180 nm CMOS |
| Speed | 1.6 GSample | ~1.05 Gsample |
| Resolution | 6-bit | 6-bit |
| Power | 340 mW | 30 mW |
| INL | 0.42 | 0.23 LSB |
| DNL | 0.4/−0.4 | 0.4/−0.3 LSB |
| Operating Range | N/A | 940 MHz-1160 MHz |
| Operating Mode | Voltage Based | Frequency Based |
| Voltage | 1.95 V Analog 2.35 Digital | 1.8 Volts |
| Area | 7.14 × 4.04 mm | 0.76 × 0.18 mm |

While a preferred embodiment has been set forth in detail above, those skilled in the art who have reviewed the present disclosure will readily appreciate that other embodiments can be realized within the scope of the invention. For example, numerical values are illustrative rather than limiting. Also, the comparators can be high-pass, low-pass, band-pass, or any other suitable comparators. Moreover, any disclosure of specific circuitry, such as the inverters in the buffers 202 and 210 or the specifics of the decoder 108, is illustrative rather than limiting, and equivalent circuitry is intended to be covered as well. Therefore, the present invention should be construed as limited only by the appended claims.

We claim:

1. A converter for converting a frequency-modulated input signal into a digital output signal, the converter comprising:
   a plurality of comparators, each receiving the frequency-modulated input signal, each for making a comparison between the frequency-modulated input signal and a frequency range and for outputting a comparison signal indicating whether the frequency-modulated input signal is within the frequency range; and
   a decoder, receiving the comparison signals from the plurality of comparators, for determining a frequency of the frequency-modulated input signal and for producing the digital output signal to represent the determined frequency.

2. The converter of claim 1, wherein the plurality of comparators are in parallel.

3. The converter of claim 2, wherein the frequency range is different for each of the plurality of comparators.

4. The converter of claim 3, wherein each of the plurality of comparators comprises:
   a capacitive load to which the frequency-modulated input signal is applied; and
   a flop circuit, connected to receive in parallel the frequency-modulated input signal and an output of the capacitive load, for making the comparison in accordance with a phase difference between the frequency-modulated input signal and the output of the capacitive load.

5. The converter of claim 4, wherein the capacitive load comprises:
   a first buffer connected to receive the frequency-modulated input signal;
   a capacitor connected between an output of the first buffer and ground; and
   a second buffer connected between the output of the first buffer and an input of the flop circuit.

6. The converter of claim 5, wherein the capacitive load further comprises an active load for providing temperature compensation for a frequency response of the comparator.

7. The converter of claim 6, wherein the active load comprises a resistor whose resistance is a function of temperature.

8. The converter of claim 1, wherein the decoder comprises a fat-tree encoder.

9. A frequency comparator for making a comparison of whether a frequency-modulated input signal is within a frequency range, the comparator comprising:
   a capacitive load to which the frequency-modulated input signal is applied; and
   a flop circuit, connected to receive in parallel the frequency-modulated input signal and an output of the capacitive load, for making the comparison in accordance with a phase difference between the frequency-modulated input signal and the output of the capacitive load.

10. The comparator of claim 9, wherein the capacitive load comprises:
   a first buffer connected to receive the frequency-modulated input signal;
   a capacitor connected between an output of the first buffer and ground; and
   a second buffer connected between the output of the first buffer and an input of the flop circuit.

11. The comparator of claim 10, wherein the capacitive load further comprises an active load for providing temperature compensation for a frequency response of the comparator.

12. The comparator of claim 11, wherein the active load comprises a resistor whose resistance is a function of temperature.

13. A method for converting a frequency-modulated input signal into a digital output signal, the method comprising:
   (a) comparing the frequency-modulated input signal to a plurality of frequency ranges to produce a plurality of comparison results;
   (b) determining a frequency of the frequency-modulated input signal from the plurality of comparison results; and
   (c) encoding the frequency determined in step (b) as the digital output signal.

* * * * *